United States Patent
Mirzaei et al.

(10) Patent No.: US 8,620,242 B2
(45) Date of Patent: Dec. 31, 2013

(54) HIGH PERFORMANCE TRANSMITTER PREAMPLIFICATION CHAIN WITH CALIBRATION FEEDBACK

(75) Inventors: Ahmad Mirzaei, San Diego, CA (US); Hooman Darabi, Laguna Niguel, CA (US); Amir Hadji-Abdolhamid, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 339 days.

(21) Appl. No.: 12/806,799

(22) Filed: Aug. 19, 2010

(65) Prior Publication Data

US 2012/0046004 A1 Feb. 23, 2012

(51) Int. Cl.
*H01Q 11/12* (2006.01)
*H04B 1/04* (2006.01)

(52) U.S. Cl.
USPC ........................... 455/127.2; 455/115.1

(58) Field of Classification Search
USPC ............... 455/127.2, 334, 115.1; 327/543
See application file for complete search history.

(56) References Cited

U.S. PATENT DOCUMENTS

| | | | |
|---|---|---|---|
| 2004/0189375 A1* | 9/2004 | Lee et al. | 327/543 |
| 2008/0311867 A1* | 12/2008 | Araki et al. | 455/127.2 |
| 2009/0111420 A1* | 4/2009 | Tasic et al. | 455/334 |
| 2012/0263256 A1* | 10/2012 | Waheed et al. | 375/296 |

* cited by examiner

*Primary Examiner* — Christian Hannon
(74) *Attorney, Agent, or Firm* — Farjami & Farjami LLP

(57) ABSTRACT

According to one embodiment, an improved preamplification chain for implementation in a transmitter comprises a frequency conversion stage for up-converting a baseband signal to a transmit signal, a variable gain control power amplifier driver for preamplifying the transmit signal, and a differential feedback calibration stage receiving first and second differential outputs of a current steering unit of the power amplifier driver and providing calibration feedback to a baseband signal generator of the transmitter. In one embodiment, the frequency conversion stage includes an adjustable low-pass filter for filtering the baseband signal, a passive mixer for up-converting the baseband signal to the transmit signal, and a clock conversion unit configured to convert a fifty percent (50%) duty cycle clock input to a twenty-five percent (25%) duty cycle clock output for driving the passive mixer.

20 Claims, 6 Drawing Sheets

HIGH PERFORMANCE TRANSMITTER PREAMPLIFICATION CHAIN WITH CALIBRATION FEEDBACK

BACKGROUND OF THE INVENTION

1. Field of the Invention

The present invention is generally in the field of electronic circuits and systems. More specifically, the present invention is in the field of communications circuits and systems.

2. Background Art

Transceivers are typically used in communications systems to support transmission and reception of communications signals through a common antenna, for example at radio frequency (RF) in a cellular telephone or other mobile communication device. A transmitter routinely implemented in such a transceiver in the conventional art may utilize several processing stages to condition and preamplify a transmit signal prior to passing the transmit signal to a power amplifier (PA). For example, the transmit signal may originate as a digital signal generated by a digital block of the transmitter. The digital signal is then typically converted into an analog baseband signal, by means of a digital-to-analog converter (DAC) for instance. The analog baseband signal may then be filtered using a low-pass filter (LPF) and up-converted to RF by a mixer, which is usually implemented as an active circuit. Subsequently, the up-converted signal can be processed by a PA driver, which then passes the preamplified transmit signal to the PA for final amplification and transmission from the transceiver antenna In a conventional transmitter preamplification chain, preamplification gain control, may be approximately evenly distributed between lower frequency gain control stages implemented prior to or in combination with up-conversion, and higher frequency gain control stages following up-conversion. In the conventional design approach, the DAC, LPF, and mixer circuits may collectively contribute a significant portion of the overall gain control, such as approximately fifty percent of the preamplification gain control, for example. However, this conventional approach is associated with significant disadvantages, owing in part to the substantial inefficiencies resulting from the time and iterative testing required to coordinate calibration amongst the various lower frequency and higher frequency gain control stages.

Additional disadvantages associated with conventional transmitter preamplification chain designs result from the inherent limitation imposed by their feedback stage architectures. For example, conventional designs result in feedback stages that are susceptible to oscillation during high gain operation. Moreover, conventional feedback stages often produce unreliable feedback data when the feedback signal includes local oscillator feedthrough.

Thus, there is a need to overcome the drawbacks and deficiencies in the art by providing an improved transmitter preamplification chain enabling efficient preamplification gain control and feedback calibration.

SUMMARY OF THE INVENTION

The present invention is directed to a high performance transmitter preamplification chain with calibration feedback, as shown in and/or described in connection with at least one of the figures, and as set forth more completely in the claims.

DETAILED DESCRIPTION OF THE INVENTION

The present invention is directed to a high performance transmitter preamplification chain with calibration feedback. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings.

Figure 1:
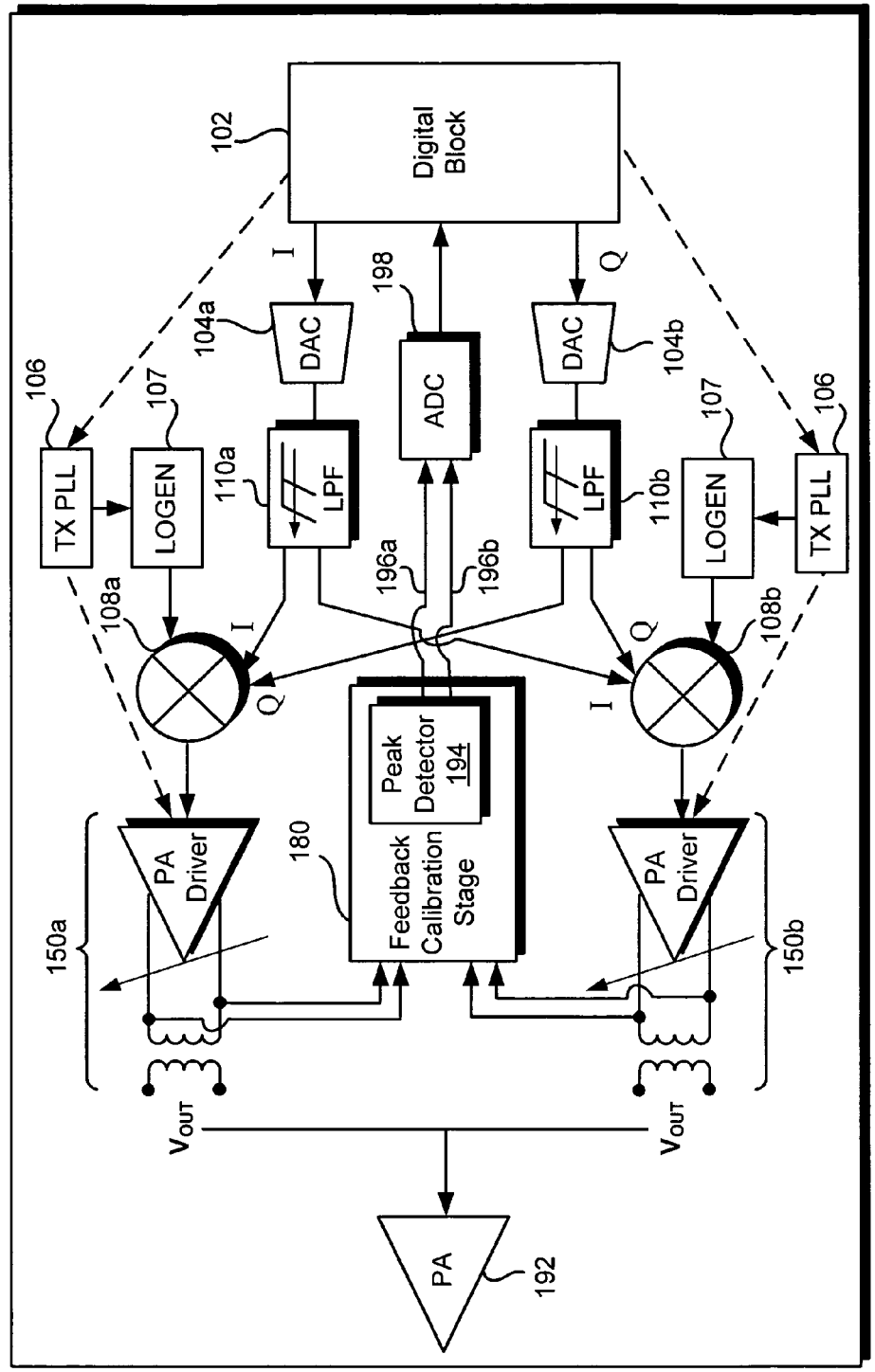
FIG. 1 is a block diagram of a transmitter including an improved performance preamplification chain, according to one embodiment of the present invention.

FIG. 1 shows a block diagram of transmitter 100 including an improved performance preamplification chain, according to one embodiment of the present invention capable of overcoming the disadvantages associated with conventional designs. As may be seen from FIG. 1, transmitter 100 may be configured to support multiple transmission modes and/or multiple transmission frequencies. For example, transmitter 100 can be configured to support high-band transmission frequencies in a range between approximately 1.8 GHz and 2.2 GHz, as well as low-band transmission frequencies ranging between approximately 0.8 GHz and 1.1 GHz.

As shown in FIG. 1, transmitter 100 includes power amplifier (PA) 192, which can be coupled to an antenna utilized by transmitter 100 (antenna not shown in FIG. 1). As further shown in FIG. 1, transmitter 100 includes a front-end comprising digital block 102 providing in-phase (I) and quadrature phase (Q) output signals, such as baseband signals, for example, to respective digital-to-analog converters (DACs) 104a and 104b. In addition, and as also shown in FIG. 1, transmitter 100 includes adjustable low-pass filters (adjustable LPFs) 110*a* and 110*b*. To support high-band frequency channels as well as low-band frequency channels, transmitter 100 includes high-band mixer 108*a* and low-band mixer 108*b*, which may be implemented as passive circuits, for example. In addition, transmitter 100 includes high-band variable gain control PA driver 150*a* and low-band variable gain control PA driver 150*b*, each configured to provide a preamplified transmit signal as a single-ended input to PA 192.

Also shown in FIG. 1 are transmitter phase-locked loop (TX PLL) 106 and local oscillator generator (LOGEN) 107, as well as differential feedback calibration stage 180 including peak detector 194 and providing calibration feedback data 196*a* and 196*b* to digital block 102 through analog-to-digital converter (ADC) 198. It is noted that although TX PLL 106 and LOGEN 107 are shown in duplicate in FIG. 1 for the purposes illustrative clarity, in practice, a single combination of TX PLL 106 and LOGEN 107 can be coupled to both respective high-band and low-band variable gain control PA drivers 150*a* and 150*b*, and can be shared by respective high-band and low-band mixers 108*a* and 108*b* as well. It is further noted that although the embodiment of FIG. 1 characterizes baseband signal generation as being performed digitally by digital block 102, that need not be the case in all embodiments. Thus, digital block 102 may be seen to correspond more generally to any suitable baseband signal generator.

Transmitter 100 may be seen to comprise an improved performance preamplification chain comprising two distinct branches, the first providing a preamplified high-band transmit signal to PA 192 and the second providing a preamplified low-band transmit signal to PA 192. That is to say, the improved performance preamplification chain can include a branch comprising adjustable LPFs 110*a* and 110*b*, LOGEN 107, and high-band mixer 108*a*, which can collectively be characterized as a frequency conversion stage of the first preamplification chain, as well as high-band variable gain control PA driver 150*a*, and differential feedback calibration stage 180. In addition, according to the embodiment shown in FIG. 1, the improved performance preamplification chain can further include a second branch comprising the frequency conversion stage of adjustable LPFs 110*a* and 110*b*, LOGEN 107, and low-band mixer 108*b*, as well as low-band variable gain PA driver 150*b*, and differential feedback calibration stage 180.

As mentioned above, the embodiment of FIG. 1 may be implemented to support multiple transmission modes, such as transmission modes employing quadrature modulation schemes and transmission modes employing polar modulation, for example. For instance, in FIG. 1, transmission modes employing quadrature modulation can be associated with the solid line signal paths linking I and Q outputs of digital block 102 to variable gain control PA drivers 150*a* and 150*b* through respective DAC/adjustable LPF/mixer combinations 104*ab*/110*ab*/108*a* and 104*ab*/110*ab*/108*b*. Analogously, transmission modes employing polar modulation can be associated with the dashed line signal paths linking digital block 102 to variable gain control PA drivers 150*a* and 150*b* through TX PLL 106.

It is noted that although some of the pre-PA signal paths shown in FIG. 1 are represented by single lines for simplicity, many of those signals can comprise paired differential signals. Thus, the I and Q outputs of digital block 102 passed to respective high-band and low-band mixers 108*a* and 108*b*, the outputs of respective high-band and low-band mixers 108*a* and 108*b*, the polar mode outputs of digital block 102 passed to variable gain control PA drivers 150*a* and 150*b* through TX PLL 106, and the feedback calibration signal returned to digital block 102 by ADC 198, for example, can comprise differential signals. It is further noted that the signal paths internal to variable gain control PA drivers 150*a* and 150*b*, as well as the feedback signals provided by those variable gain control PA drivers to differential feedback calibration stage 180 and the calibration feedback data 196*a* and 196*b* output by peak detector 194 are explicitly shown as differential signals.

As further shown in FIG. 1, the I and Q signal paths provided by respective DACs 104*a* and 104*b* and adjustable LPFs 110*a* and 110*b* can be shared between the high-band and low-band transmission signals. Moreover, a single implementation of each of digital block 102, TX PLL 106, LOGEN 107, feedback calibration stage 180, ADC 198, and PA 192 may be used to support all transmission modes and all transmission frequency bands. Consequently, transmitter 100 is characterized by a compact space saving architecture that may be particularly well suited to meet increasingly fine dimensional and lower power consumption constraints as fabrication technologies transition to the 40 nm node, for example, and beyond.

Transmitter 100 may be implemented as part of a communications transceiver, for example, utilized in a cellular telephone or other mobile communication device operating at RF, such as in a frequency range from approximately 0.8 GHz to approximately 2.2 GHz. Moreover, in one embodiment, transmitter 100 can be implemented as part of a transceiver integrated circuit (IC) fabricated on a single semiconductor die using a 40 nm process technology, for example.

Figure 2:
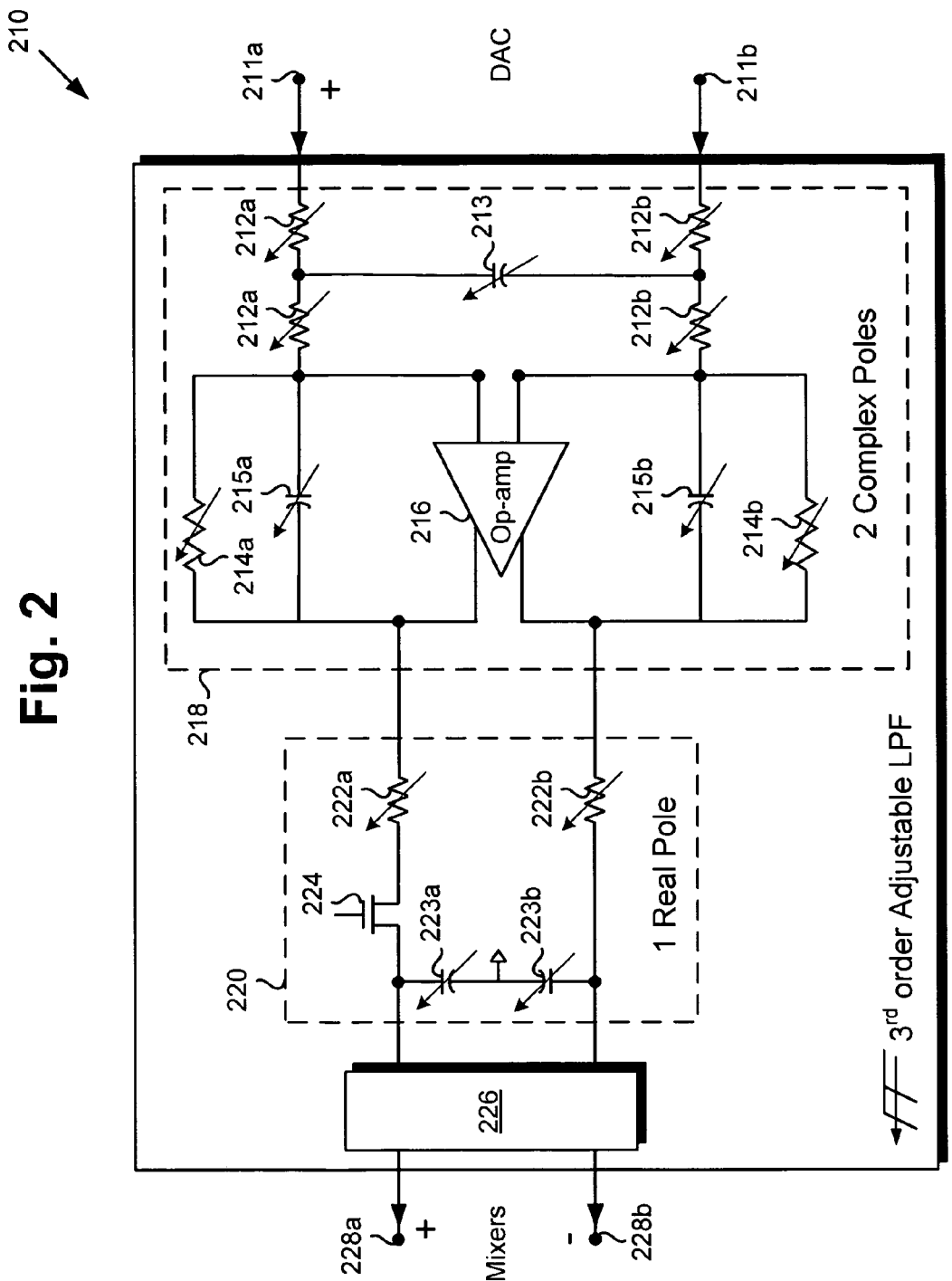
FIG. 2 is a block diagram of a third-order adjustable low-pass filter suitable for implementation in a frequency conversion stage of an improved performance transmitter preamplification chain, according to one embodiment of the present invention.
Figure 3:
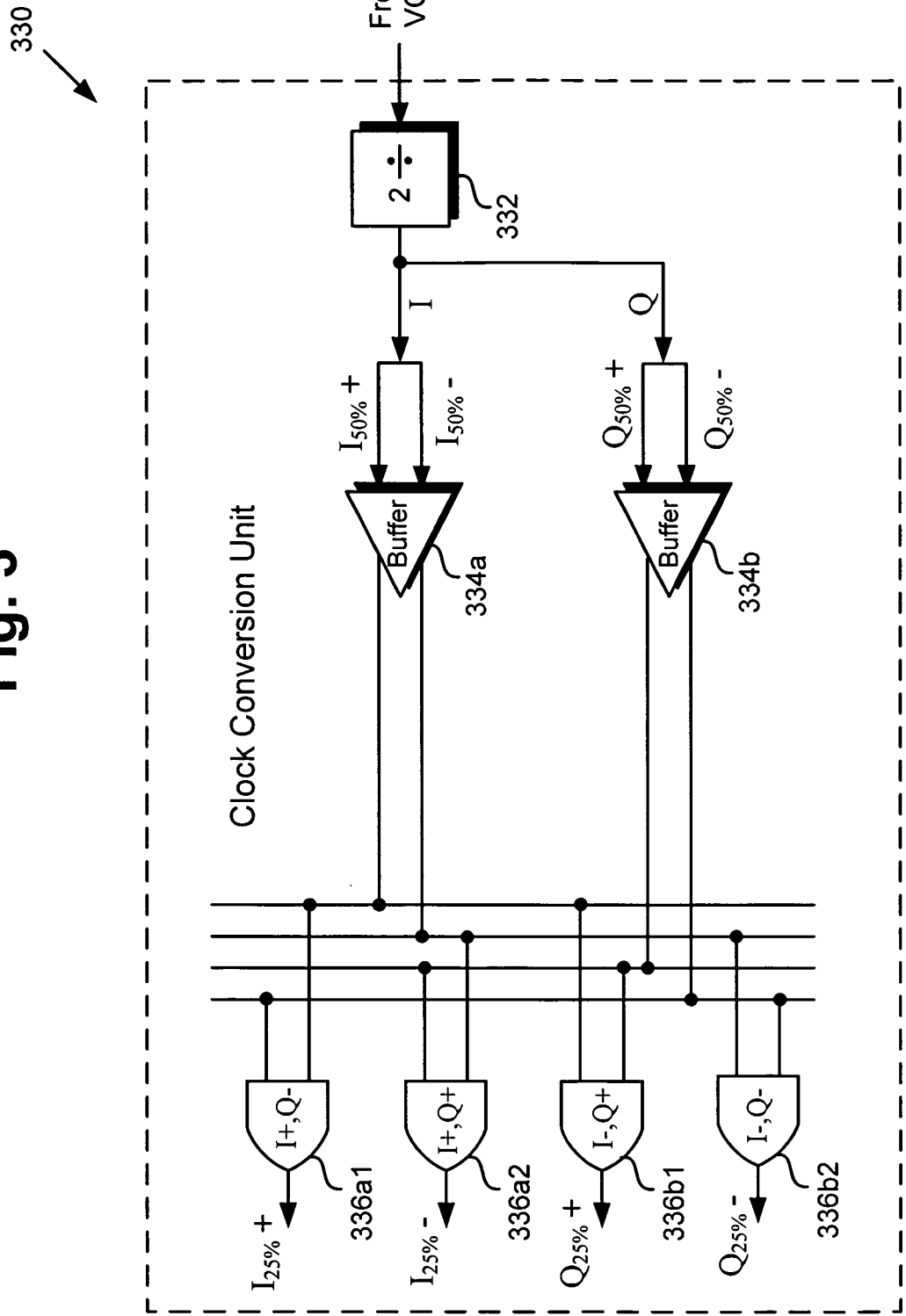
FIG. 3 is a block diagram of a clock conversion unit suitable for implementation in a frequency conversion stage of an improved performance transmitter preamplification chain, according to one embodiment of the present invention.
Figure 4A:
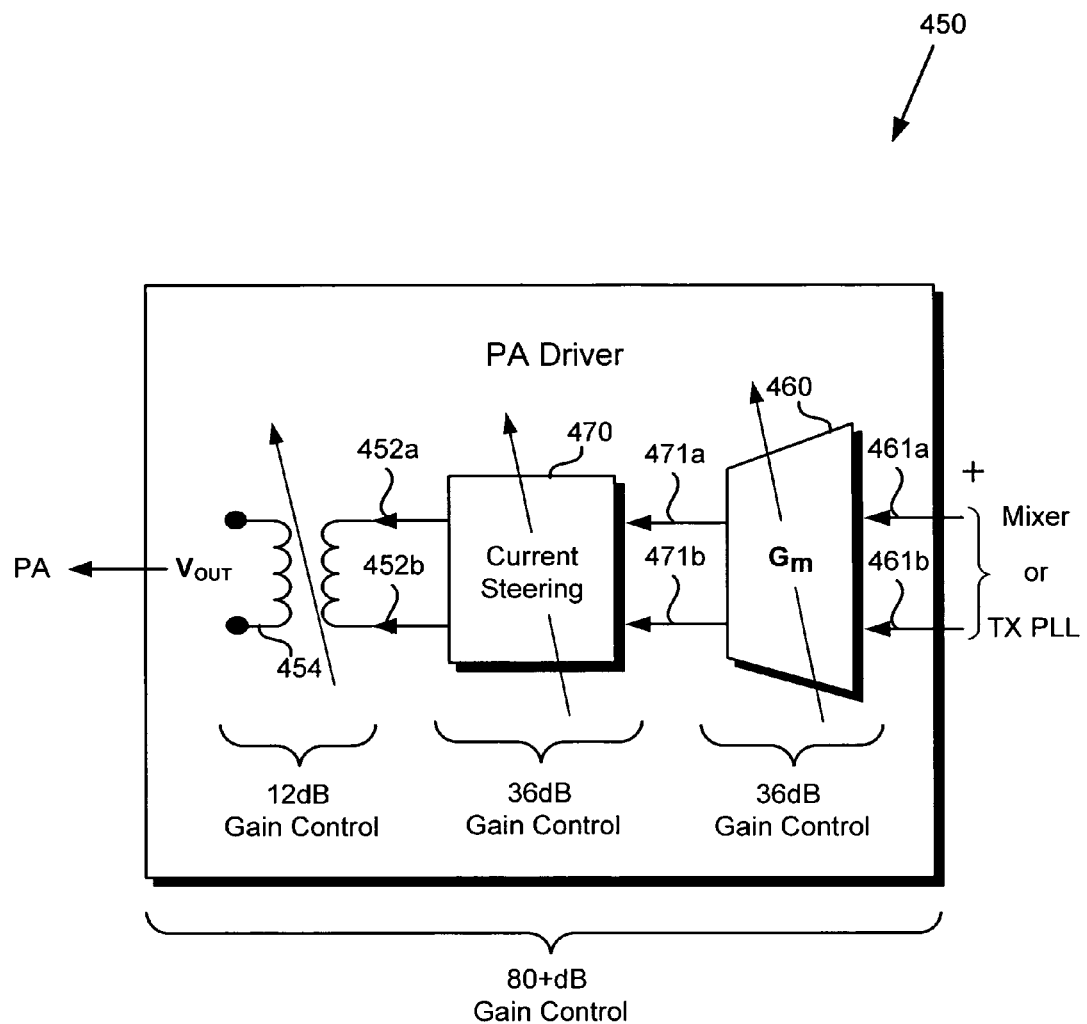
FIG. 4A is a block diagram showing elements of a variable gain control power amplifier (PA) driver suitable for implementation in an improved performance transmitter preamplification chain, according to one embodiment of the present invention.
Figure 4B:
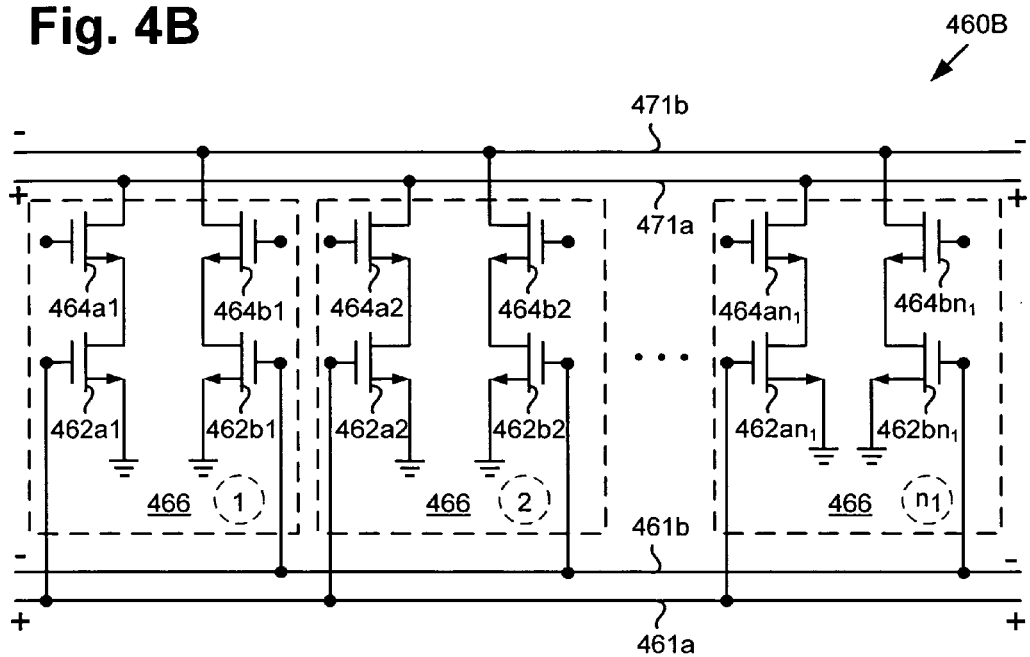
FIG. 4B is a block diagram showing selectively activated gain control unit cells included in a transconductance amplifier of the PA driver of FIG. 4A, according to one embodiment of the present invention.
Figure 4C:
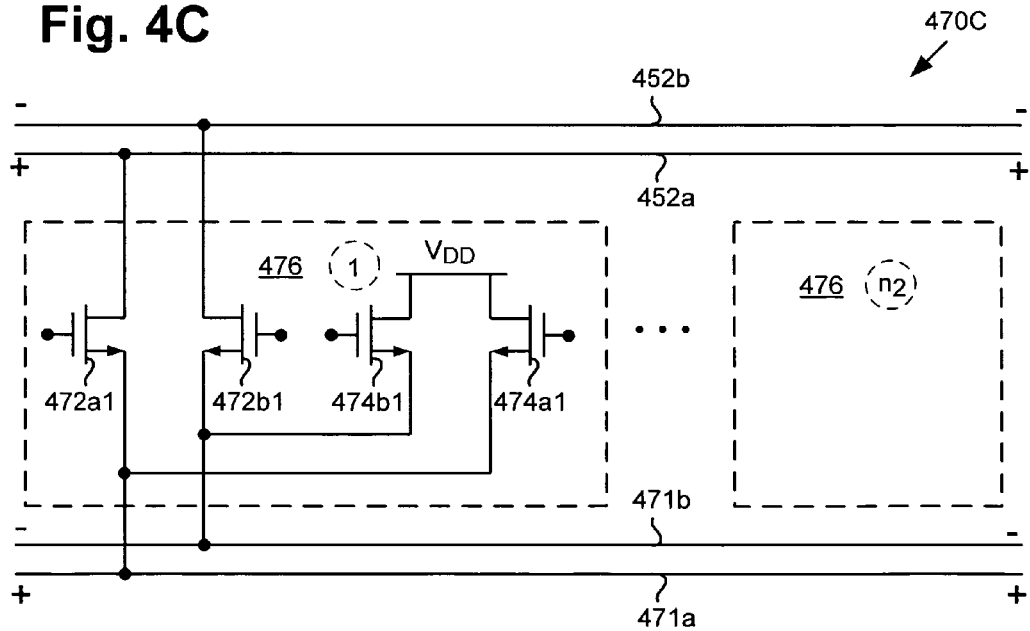
FIG. 4C is a block diagram depicting selectively activated gain control unit cells included in a current steering unit of the PA driver of FIG. 4A, according to one embodiment of the present invention.
Figure 5:
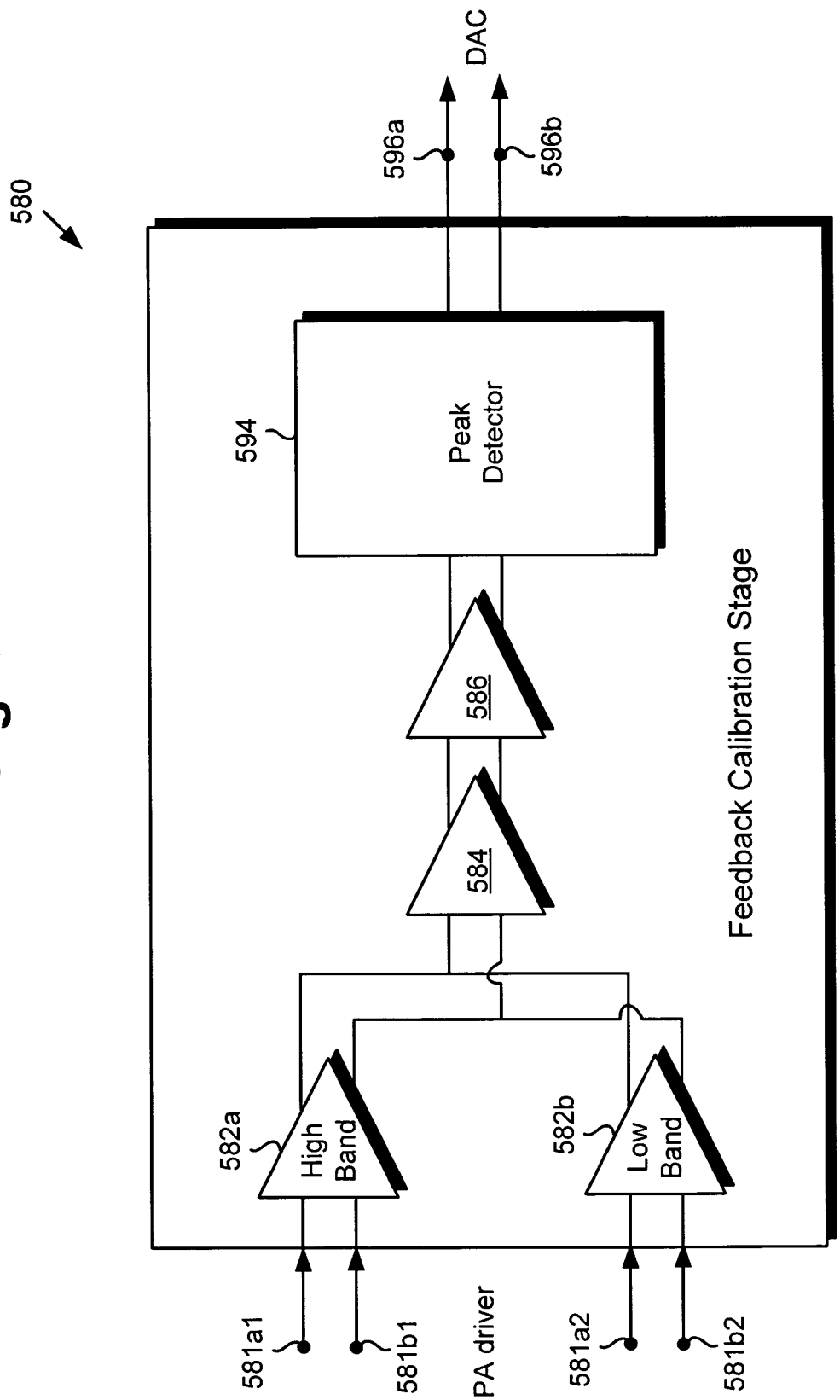
FIG. 5 is a block diagram showing elements of a feedback calibration stage suitable for implementation in an improved performance transmitter preamplification chain, according to one embodiment of the present invention.

Turning now to FIGS. 2, 3, 4A, 4B, 4C and 5, those figures show constituent circuits comprised by the improved performance transmitter chains described above, in greater detail. For example, FIG. 2 shows a third-order ($3^{rd}$-order) adjustable LPF and FIG. 3 shows a clock conversion unit of a LOGEN, each suitable for implementation in a frequency conversion stage of the improved performance preamplification chain of transmitter 100, in FIG. 1, according to embodiments of the present invention. Moreover, FIGS. 4A, 4B, and 4C show elements of a variable gain control PA driver, and FIG. 5 shows elements of a feedback calibration stage, all suitable for implementation in the improved performance transmitter preamplification chain of transmitter 100, according to embodiments of the present invention.

Referring first to FIG. 2, $3^{rd}$-order adjustable LPF 210 having differential inputs 211*a* and 211*b* and providing differential mixer inputs 228*a* and 228*b*, corresponds to either or both of adjustable LPFs 110*a* and 110*b*, in FIG. 1. As shown in FIG. 2, $3^{rd}$-order adjustable LPF 210 includes double complex pole arrangement 218 followed by a single real pole implemented using tunable RC filter 220. That is to say, double complex pole arrangement 218 receives differential input signals to $3^{rd}$-order adjustable LPF through differential inputs 211*a* and 211*b*, while single real pole tunable RC filter 220 provides differential output signals from $3^{rd}$-order adjustable LPF 210 through source follower buffer 226, which serves as an interface between the output signals produced by $3^{rd}$-order adjustable LPF 210 and the passive mixers having differential inputs 228*a* and 228*b*.

It is noted that although the mixer circuits having differential inputs 228*a* and 228*b* are not explicitly shown in FIG. 2, those frequency conversion stage circuit elements can be seen to correspond to either or both of high-band mixer 108*a* and low-band mixer 108*b*, in FIG. 1. If is further noted that although the embodiment of FIG. 2 shows source follower buffer 226 as being incorporated into $3^{rd}$-order adjustable LPF 210, in other embodiments, source follower buffer 226 can comprise a separate circuit implemented as an interface circuit between an output of $3^{rd}$-order adjustable LPF 210 and one or more passive mixer inputs.

Double complex pole arrangement 218 comprises two complex poles implemented using single operational amplifier (op-amp) 216. In addition to single op-amp 216, double complex pole arrangement includes variable input resistors 212a and 212b, and variable input capacitor 213. Double complex pole arrangement 218 also includes the combination of variable resistor 214a and variable capacitor 215a coupled in parallel between a differential input of op-amp 216 and a corresponding differential output, and the combination of variable resistor 214b and variable capacitor 215b coupled in parallel between another differential input of op-amp 216 and another corresponding differential output.

As further shown in 2, single real pole tunable RC filter 220 comprises one real pole implemented using variable resistors 222a and 222b, variable capacitors 223a and 223b sharing a common ground node, and native switch 224 situated in one of the two differential signal paths through $3^{rd}$-order adjustable LPF 210. According to the embodiment of FIG. 2, native switch 224 is situated in the positive differential signal path coupling differential input 211a and passing through variable resistor 222a. It is noted that the native switch (or native transistor or native device) is generally a thick oxide transistor having a negative threshold. The negative threshold in the present exemplary embodiment results in, for example, a better noise performance.

The embodiment of $3^{rd}$-order adjustable LPF 210 can be utilized to implement a $3^{rd}$-order Chebyshev filter, for example. The pole and frequency characteristics of $3^{rd}$-order adjustable LPF 210 can be tuned using variable resistors 212a/b, 214a/b, 222a/b, and variable capacitors 213, 215a/b, and 223a/b, for example. Thus, in one embodiment $3^{rd}$-order adjustable LPF 210 may be implemented in a multi-mode RF transmitter to concurrently support communications in a second-generation wireless telephone technology (2G) mode, as well as in a 3G mode, for example, through scaling of the variable capacitors and resistors internal to $3^{rd}$-order adjustable LPF 210. In addition, implementation of variable resistances and capacitances in $3^{rd}$-order adjustable LPF 210 enable tuning of $3^{rd}$-order adjustable LPF 210 to advantageously ensure that the RC of the filter remains substantially constant over process-voltage-temperature (PVT) variations. Moreover, use of source follower buffer circuit 226 as an output interface circuit presents a low output impedance from $3^{rd}$-order adjustable LPF 210, making $3^{rd}$-order adjustable LPF 210 suitable for use in combination with passive mixers receiving differential inputs 228a and 228b, for example.

Moving to FIG. 3, FIG. 3 shows clock conversion unit 330 suitable for implementation in a frequency conversion stage of an improved performance transmitter preamplification chain, according to one embodiment of the present invention. Clock conversion unit 330 is configured to convert a fifty percent (50%) duty cycle clock input to a twenty-five percent (25%) duty cycle clock output for driving a passive mixer (mixer not shown in FIG. 3). Clock conversion unit 330 may be included as part of LOGEN 107, in FIG. 1, and be used to drive high-band mixer 108a and low-band mixer 108b, which as previously noted, may be implemented as passive mixers for up-converting a baseband signal of transmitter 100 to a transmit signal at a transmit frequency.

According to the embodiment of FIG. 3, clock conversion unit 330 comprises divide-by-two block 332 for receiving an input signal from the LOGEN circuit voltage-controlled oscillator (VCO), for example via an input buffer (input buffer not shown in FIG. 3). The clock conversion unit represented by FIG. 3 may be used in conjunction with a high-band signal generation path, and is shown to include respective I and Q differential signal buffers for buffering the 50% duty cycle I and Q clock signals output by divide-by-two block 332. By analogy, a clock conversion unit for use with a low-band signal generation path may comprise two sequential divide-by-two blocks such as divide-by-two block 332, coupled between the input buffer and differential signal buffers 334a and 334b. As further indicated in FIG. 3, clock conversion unit 330 includes a plurality of logic gates, shown as AND gates 336a1, 336a2, 336b1, and 336b2, in the present embodiment. It is noted that, in addition to AND gates 336a1, 336a2, 336b1, and 336b2, divide-by-two block 332 and differential signal buffers 334a and 334b may be implemented as digital circuitry.

As shown in FIG. 3, each of AND gates 336a1, 336a2, 336b1, and 336b2 is configured to receive either a positive or a negative Q differential signal having a 50% duty cycle as a first input, and either a positive or a negative I differential signal having a 50% duty cycle as a second input. As further shown in FIG. 3, the sequencing of the I and Q differential inputs is such that AND gates 336a1, 336a2, 336b1, and 336b2 provide 25% duty cycle I and Q differential outputs. Although the embodiment of FIG. 3 represents clock conversion as being achieved through the use of four AND gates, e.g., AND gates 336a1, 336a2, 336b1, and 336b2, other embodiments of the present invention may comprise a clock conversion unit using more, or fewer, logic gates, and which may include logic gates other than AND gates, for example.

The specific combination of 50% duty cycle inputs to AND gates 336a1, 336a2, 336b1, and 336b2 producing 25% duty cycle outputs can vary according to the sequencing of the I and Q differential signals. For example, the embodiment of FIG. 3 reflects a "clockwise" sequencing in which the respective I differential signals precede their corresponding Q counterparts by ninety degrees (90°). Consequently, the embodiment of FIG. 3 shows AND gates 336a1 and 336a2 outputting respective positive and negative differential I signals having 25% duty cycles, and shows AND gates 336b1 and 336b2 outputting respective positive and negative differential Q signals having 25% duty cycles. Thus, a different sequencing of I and Q outputs from divide-by-two block 332 would necessitate a different combination of inputs applied to AND gates 336a1, 336a2, 336b1, and 336b2. However, because the sequencing produced by divide-by-two block 332 is typically consistent, the appropriate combination of inputs can be identified and assigned for reliable conversion of a 50% duty cycle clock signal to a 25% duty cycle clock signal.

Generation of a 25% duty cycle clock may be particularly advantageous in frequency conversion stages such as those implemented in transmitter 100, in FIG. 1. For example, because each of high-band mixer 108a and low-band mixer 108b may be a passive mixer, and because each of high-band mixer 108a and low-band mixer 108b is shown to be coupled to the output of both of adjustable LPFs 110a and 110b, use of a 25% duty cycle clock to drive high-band mixer 108a and low-band mixer 108b helps to prevent the occurrence of an overlap in which adjustable LPFs 110a and 110b might be undesirably shorted together so as to load one another.

Turning now to FIG. 4A, FIG. 4A is a block diagram showing elements of variable gain control PA driver 450 suitable for implementation in an improved performance transmitter preamplification chain, according to one embodiment of the present invention. Variable gain control PA driver 450 can be seen to correspond to either or both of respective high-band and low-band variable gain control PA drivers 150a and 150b, in FIG. 1. As shown in FIG. 4A, according to the present embodiment, variable gain control PA driver 450 comprises a plurality of variable gain control stages including variable gain transconductance amplifier 460 receiving differential inputs 461*a* and 461*b*, variable gain current steering unit 470, and variable gain output transformer 454. As further shown in FIG. 4A, variable gain transconductance amplifier 460 receives differential inputs 461*a* and 461*b*, and variable gain current steering unit 470 provides differential outputs 452*a* and 452*b*. Also shown in FIG. 4A are differential signals 471*a* and 471*b*, which may be seen to represent output signals from variable gain transconductance amplifier 460, as well as to represent input signals to variable gain current steering unit 470.

According to the embodiment shown in FIG. 4A, variable gain control PA driver 450 receives differential inputs 461*a* and 461*b* from a mixer or TX PLL (neither mixer nor TX PLL shown in FIG. 4A), such as high-band mixer 108*a*, low-band mixer 108*b*, or TX PLL 106, in FIG. 1, and provides a preamplified transmit signal as a single ended output $V_{OUT}$ to a PA (also not shown in FIG. 4A), such as PA 192 in FIG. 1. As indicated in FIG. 4A, the embodiment of variable gain control PA driver 450 shown by that figure is designed to provide approximately 80 dB or more of preamplification gain control.

As shown in FIG. 4A, in the present embodiment, approximately 36 dB of preamplification gain control is provided by each of variable gain transconductance amplifier 460 and variable gain current steering unit 470, while variable gain output transformer 454 provides an additional approximately 12 dB of gain control. Moreover, one or both of variable gain transconductance amplifier 460 and variable gain current steering unit 434 can be implemented using respective arrays of selectively activated gain control unit cells to provide accurate gain control steps of better than approximately 1.0 dB each, for example, such as approximately 0.5 dB of preamplification gain control per gain control unit cell. Thus, substantially all of the pre-PA gain control produced by transmitter 100, in FIG. 1, can be provided at transmit frequency, after up-conversion of the baseband signal by the frequency conversion stages of transmitter 100.

Referring to FIGS. 4B and 4C, FIG. 4B shows example array 460B of selectively activated gain control unit cells comprised by variable gain transconductance amplifier 460, while FIG. 4C shows example array 470C of selectively activated gain control unit cells comprised by variable gain current steering unit 470, according to embodiments of the present invention. It is noted that the particular array geometries represented in FIGS. 4B and 4C are merely illustrative, and in other embodiments, selectively activated gain control unit cells may be arranged differently.

As shown in FIG. 4B, according to the present embodiment, selectively activated gain control unit cell array 460B comprises a number "$n_1$" of gain control unit cells 466. Each selectively activated gain control unit cell 466 includes differential input devices 462*a* and 462*b* coupled to respective differential inputs 461*a* and 461*b* to variable gain transconductance amplifier 460. Each selectively activated gain control unit cell further comprises first and second cascode devices 464*a* and 464*b* coupling respective differential input devices 462*a* and 462*b* to respective differential outputs 471*a* and 471*b* of variable gain transconductance amplifier 460. That is to say, a first selectively activated gain control unit cell 466 comprises differential input devices 462*a*1 and 462*b*1 and first and second cascode devices 464*a*1 and 464*b*1, a second selectively activated gain control unit cell 466 comprises differential input devices 462*a*2 and 462*b*2 and first and second cascode devices 464*a*2 and 464*b*2, and so forth, until finally the $n_1$ selectively activated gain control unit cell comprises differential input devices 462*an$_1$* and 462*bn$_1$* and first and second cascode devices 464*an$_1$* and 464*bn$_1$*. In so far as all of the $n_1$ gain control unit cells shown in FIG. 4B are substantially identical, their gain control functionality can be described by reference to the operation of any one gain control unit cell, such as the first cell.

Focusing on the first selectively activated gain control unit cell comprising differential input devices 462*a*1 and 462*b*1 and cascode devices 464*a*1 and 464*b*1, it is first noted that each of those devices is represented in FIG. 4B as an n-channel field-effect transistor (NFET). That representation is merely exemplary, however, and other embodiments of the present invention can be implemented using other types of input and cascode devices. According to the embodiment of FIG. 4B, the control terminals, e.g., gates, of input devices 462*a*1 and 462*b*1 are connected to respective differential inputs 461*a* and 461*b* of variable gain transconductance amplifier 460, as are, respectively, the control terminals of all other input devices of array 460B. In addition, corresponding first power terminals, e.g., sources, of differential input devices 462*a*1 and 462*b*1, as well as all input devices of array 460B, are grounded.

First and second cascode devices 464*a*1 and 464*b*1 each have a respective first power terminal, e.g., source, coupled to a second power terminal, e.g., drain, of respective differential input devices 462*a*1 and 462*b*1. First and second cascode devices 464*a*1 and 464*b*1 each have a respective second power terminal, e.g., drain, coupled to respective differential outputs 471*a* and 471*b* of variable gain transconductance amplifier 460. Moreover, the respective control terminals, e.g., gates, of first and second cascode devices 464*a*1 and 464*a*2, which may be coupled together, for example, (coupling not shown in FIG. 4B) can be selectively connected to one of ground or a reference voltage (ground and reference voltage source also not shown in FIG. 4B) to selectively deactivate or activate, respectively, the gain control unit cell. Thus, the control terminals of each of cascode devices 464*a*1, 464*b*1, 464*a*2, 464*b*2, ... 464*an$_1$*, 464*bn$_1$* can each be placed in one of two states: those devices either have their control terminals connected to a reference voltage so as to be turned ON, thereby activating their respective gain control unit cell, or they have their control terminals grounded so as to be turned OFF, thereby not contributing to the output of variable gain transconductance amplifier 460 provided at differential outputs 471*a* and 471*b*.

Selectively activated gain control unit cell array 460B may comprise any suitable number $n_1$ of selectively activated gain control unit cells, such as sixty-four selectively activated gain control unit cells, for example. Implementation of an array of selectively activated gain control unit cells, such as array 460B of selectively activated gain control unit cells 466 in variable gain transconductance amplifier 460 provides both large preamplification gain and accurate gain control steps. Thus, array 460B can be used to produce approximately 36 dB of gain, for example, with a gain control resolution of better than approximately 1.0 dB.

Moving to FIG. 4C, according to the embodiment shown in that figure, selectively activated gain control unit cell array 470C comprises "$n_2$" selectively activated gain control unit cells 476. Each selectively activated gain control unit cell 476 includes differential input devices 472*a* and 472*b*, each coupled between respective differential inputs 471*a* and 471*b* and respective differential outputs 452*a* and 452*b* of variable gain current steering unit 470. Each selectively activated gain control unit cell further comprises differential attenuation devices 474*a* and 474*b* coupling respective differential inputs 471*a* and 471*b* to $V_{DD}$. That is to say, a first selectively activated gain control unit cell 476 comprises differential input devices 472a1 and 472b1 and differential attenuation devices 474a1 and 474b1, and so forth, until finally the $n_2$ selectively activated gain control unit cell comprises differential input devices 472$an_2$ and 472$bn_2$ and differential attenuation devices 474$an_2$ and 474$bn_2$.

Focusing on the first selectively activated gain control unit cell comprising differential input devices 472a1 and 472b1 and differential attenuation devices 474a1 and 474b1 as representative of the operation of any of the $n_2$ selectively activated gain control unit cells comprised by array 470C, it is first noted that each of those devices is represented in FIG. 4C an NFET. As is the case for array 460B, in FIG. 4B, however, that representation is merely exemplary, and other embodiments of array 470C, in FIG. 4C, can be implemented using other types of input and attenuation devices. According to the embodiment of FIG. 4C corresponding first power terminals, e.g., sources, of differential input devices 472a1 and 472b1, as well as all respective corresponding power terminals of the input devices of array 470C, are connected to respective differential inputs 471a and 471b of variable gain current steering unit 470. In addition, corresponding opposite power terminals, e.g., drains, of differential input devices 472a1 and 472b1, as well as all respective corresponding power terminals of the input devices of array 470C, are connected to respective differential outputs 452a and 452b of variable gain current steering unit 470.

The respective control terminals, e.g., gates, of differential input devices 472a1 and 472b1 may be coupled together, for example, (coupling not shown in FIG. 4C) and can be selectively connected to one of ground or a reference voltage (ground and reference voltage source also not shown in FIG. 4C) to selectively conduct input signals received at differential inputs 471a and 471b to differential outputs 452a and 452b. Analogously, the respective control terminals, e.g., gates, of differential attenuation devices 474a1 and 474b1 may also be coupled together (coupling not shown in FIG. 4C) and can also be selectively connected to one of ground or a reference voltage to selectively attenuate the input signals received at differential inputs 471a and 471b of variable gain current steering unit 470. Thus, the control terminals of each of differential input devices 472a1, 472b1, . . . 472$an_2$, 472$bn_2$ and each of differential attenuation devices 474a1, 474b1, . . . 474$an_2$, 474$bn_2$ can be placed in one of two states: those devices either have their control terminals connected to a reference voltage so as to be turned ON, or the have their control terminals grounded so as to be turned OFF. Moreover, in one embodiment, coupling of the control gates may be coordinated so that differential input devices 472a1, 472b1, . . . 472$an_2$, 472$bn_2$ are ON only when their respective corresponding differential attenuation devices 472a1, 472b1, . . . 472$an_2$, 472$bn_2$ are OFF, and wherein differential input devices 472a1, 472b1, . . . 472$an_2$, 472$bn_2$ are OFF when their respective corresponding differential attenuation devices 472a1, 472b1, . . . 472$an_2$, 472$bn_2$ are ON.

Array 470C may comprise any suitable number $n_2$ of selectively activated gain control unit cells, such as thirty-two selectively activated gain control unit cells, for example. Implementation of an array of selectively activated gain control unit cells, such as array 470C of selectively activated gain control unit cells 476, in variable gain current steering unit 470 provides accurate preamplification gain control steps. Thus, the array 470C can be used to provide approximately 36 dB of gain control, for example, with a gain control resolution of better than approximately 1.0 dB.

Referring finally to FIG. 5, FIG. 5 shows feedback calibration stage 580 suitable for implementation in an improved performance transmitter preamplification chain, according to one embodiment of the present invention. Feedback calibration stage 580 includes peak detector 594, and corresponds to feedback calibration stage 180 including peak detector 194, in FIG. 1. As may be apparent by combined reference to FIGS. 1, 4A, and 5, feedback calibration stage 580, in FIG. 5, can be configured to receive differential outputs 452a and 452b from variable gain current steering unit 470 of variable gain control PA driver 450 at either of differential inputs 581a1 and 581b1, or 581a2 and 581b2, and to provide calibration feedback data to a baseband signal generator of transmitter 100, such as digital block 102 of transmitter 100, as differential outputs 596a and 596b, corresponding respectively to calibration feedback data 196a and 196b.

As shown in FIG. 5, in addition to peak detector 594, feedback calibration stage 580 comprises high-band input differential amplifier 582a, low-band input differential amplifier 582b, and follower differential amplifiers 584 and 586. High-band input differential amplifier 582a receives differential outputs 452a and 452b from the variable gain current steering unit of high-band variable gain control PA driver 150a at inputs 581a1 and 581b1. Similarly, low-band input differential amplifier 582b receives differential outputs 452a and 452b from the variable gain current steering unit of low-band variable gain control PA driver 150b at inputs 581a2 and 581b2. Multiplexing, or band selection, can be effectively provided by respective high-band and low-band input differential amplifiers 582a and 582b. For example, feedback calibration stage 580 can be configured such that high-band input differential amplifier 582a is OFF and has a high impedance while low-band input differential amplifier 582b is ON. Analogously, feedback calibration stage 580 can be configured so that low-band input differential amplifier 582b is OFF and has a high impedance while high-band input differential amplifier 582a is ON.

Follower differential amplifier 584 is situated between the inputs to follower differential amplifier 586 and the outputs of respective high-band and low-band input differential amplifiers 582a and 582b. According to the description provided above, feedback calibration stage 580 can provide band selection as well as band isolation through selective activation of one of respective high-band and low-band input differential amplifiers 582a and 582b while the other presents a high impedance. Thus, follower differential amplifier 584 can be selectively coupled to the outputs of one of respective high-band and low-band input differential amplifiers 582a and 582b, according to their respective activation states, for example. As shown in FIG. 5, follower differential amplifier 586 receives differential outputs from follower differential amplifier 584, and provides its differential outputs to peak detector 594.

The present use of differential amplifier stages in feedback and calibration stage 580 provides significant advantages over conventional implementations in which single ended amplification stages are typically utilized. For example, reliance on differential amplification stages in the embodiment of FIG. 5 renders feedback and calibration stage 580 highly immune to oscillation. In addition, the use of differential amplifiers in feedback and calibration stage 580 provides enhanced common mode and supply rejection, thereby improving the quality of the calibration feedback data provided by feedback calibration stage 580 when compared with conventional designs.

Thus, the present application discloses multiple design improvements and innovations resulting in improved performance by a transmitter preamplification chain. For example, introduction of adjustable LPFs and their use in combination with passive mixers driven by a 25% duty cycle clock produce a frequency conversion stage for efficient up-conversion of a baseband signal to a transmit signal. In addition, introduction of a PA driver implementing one or more arrays of selectively activated gain control unit cells discloses a solution providing improved gain, and enhanced gain control resolution, while performing substantially all gain control at a transmit frequency of the transmitter. Moreover, disclosure of a feedback calibration stage implementing differential amplification reveals an approach to feedback calibration that is both resistant to oscillation and provides improved common mode and supply rejection.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A preamplification chain in a transmitter, said preamplification chain comprising:
   a frequency conversion stage for up-converting a baseband signal to a transmit signal;
   a variable gain control power amplifier (PA) driver for preamplifying said transmit signal, said variable gain control PA driver including a current steering unit; and
   a feedback calibration stage configured to provide band selection, receiving first and second differential outputs of said current steering unit and providing calibration feedback to a baseband signal generator of said transmitter.

2. The preamplification chain of claim 1, wherein said feedback calibration stage is configured to perform feedback calibration for a plurality of transmission modes.

3. The preamplification chain of claim 1, further comprising: another variable gain control PA driver for preamplifying another transmit signal, said another variable gain control PA driver including another current steering unit;
   said feedback calibration stage receiving first and second differential outputs of said another current steering unit and providing another calibration feedback to said baseband signal generator.

4. The preamplification chain of claim 3, wherein said feedback calibration stage comprises:
   first and second input differential amplifiers;
   said first input differential amplifier configured to receive said first and second differential outputs of said current steering unit;
   said second input differential amplifier configured to receive first and second differential outputs of another current steering unit.

5. The preamplification chain of claim 4, wherein said feedback calibration stage is configured such that said first input differential amplifier is OFF and has a high impedance while said second input differential amplifier is ON.

6. The preamplification chain of claim 4, wherein said feedback calibration stage further comprises first and second follower differential amplifiers.

7. The preamplification chain of claim 1, wherein said frequency conversion stage comprises:
   an adjustable low-pass filter (LPF) for filtering said baseband signal;
   a passive mixer for up-converting said baseband signal to said transmit signal; and
   a clock conversion unit configured to convert a fifty percent (50%) duty cycle clock input to a twenty-five percent (25%) duty cycle clock output for driving said passive mixer.

8. The preamplification chain of claim 1, wherein said variable gain control PA driver comprises:
   a transconductance amplifier; and
   a current steering unit;
   wherein gain control by at least one of said transconductance amplifier and said current steering unit is provided using an array of selectively activated gain control unit cells.

9. A frequency conversion stage in a transmitter preamplification chain, said frequency conversion stage comprising:
   an adjustable low-pass filter (LPF) for filtering a baseband signal and providing differential mixer inputs;
   a passive mixer for up-converting said baseband signal to a transmit signal, said passive mixer coupled to an output of said adjustable LPF and another output of another LPF; and
   a clock conversion unit configured to convert a fifty percent (50%) duty cycle clock input to a twenty-five percent (25%) duty cycle clock output for driving said passive mixer.

10. The frequency conversion stage of claim 9, wherein said adjustable LPF comprises a three-pole LPF having not more than one operational amplifier (op-amp).

11. The frequency conversion stage of claim 10, wherein said three-pole LPF comprises two complex poles implemented using said not more than one op-amp, followed by one real pole implemented using a tunable RC filter.

12. The frequency conversion stage of claim 9, wherein a differential signal path of said adjustable LPF includes a native switch.

13. The frequency conversion stage of claim 9, wherein said adjustable LPF comprises a third-order Chebyshev filter.

14. The frequency conversion stage of claim 9, wherein a source follower buffer is implemented as an interface circuit between said output of said adjustable LPF and an input of said passive mixer.

15. The frequency conversion stage of claim 9, wherein said clock conversion unit includes a plurality of logic gates, each of said plurality of logic gates configured to receive one of a positive and a negative quadrature phase (Q) differential signal as a first fifty percent (50%) duty cycle clock input, and one of a positive and a negative in-phase (I) differential signal as a second fifty percent (50%) duty cycle clock input.

16. The frequency conversion stage of claim 15, wherein said plurality of logic gates comprises four AND gates, each of said four AND gates providing one of four respective twenty-five percent (25%) duty cycle I and Q differential outputs.

17. A variable gain control power amplifier (PA) driver in a preamplification chain of a transmitter, said variable gain control PA driver comprising:
   a transconductance amplifier; and
   a current steering unit providing differential outputs to a variable gain output transformer;

wherein gain control by at least one of said transconductance amplifier and said current steering unit is provided using an array of selectively activated gain control unit cells.

18. The variable gain control PA driver of claim 17, wherein said variable gain control PA driver is configured to provide more than approximately 80 dB of gain control at a gain control resolution of better than 1 dB.

19. The variable gain control PA driver of claim 17, wherein first and second differential outputs of said current steering unit are coupled to a baseband signal generator of said transmitter by a feedback calibration stage providing calibration feedback to said baseband signal generator.

20. The variable gain control PA driver of claim 17, wherein said variable gain output transformer is configured to provide a single ended output of said preamplification chain to a PA of said transmitter.

* * * * *